United States Patent
Masuda et al.

(10) Patent No.: US 9,914,853 B2
(45) Date of Patent: Mar. 13, 2018

(54) SLURRY COMPOSITION AND METHOD FOR POLISHING SUBSTRATE

(71) Applicant: Nihon Cabot Microelectronics K.K., Tsu-shi (JP)

(72) Inventors: Tsuyoshi Masuda, Tsu (JP); Hiroshi Kitamura, Tsu (JP); Yoshiyuki Matsumura, Tsu (JP)

(73) Assignee: Nihon Cabot Microelectronics K.K. (JP)

( * ) Notice: Subject to any disclaimer, the term of this patent is extended or adjusted under 35 U.S.C. 154(b) by 0 days.

(21) Appl. No.: 15/126,543

(22) PCT Filed: Mar. 17, 2015

(86) PCT No.: PCT/JP2015/057924
§ 371 (c)(1),
(2) Date: Sep. 15, 2016

(87) PCT Pub. No.: WO2015/141687
PCT Pub. Date: Sep. 24, 2015

(65) Prior Publication Data
US 2017/0037278 A1    Feb. 9, 2017

(30) Foreign Application Priority Data

Mar. 17, 2014 (JP) ................. 2014-053262

(51) Int. Cl.
*C09G 1/02* (2006.01)
*H01L 21/306* (2006.01)
*H01L 21/02* (2006.01)
*C09K 3/14* (2006.01)

(52) U.S. Cl.
CPC .............. *C09G 1/02* (2013.01); *C09K 3/1463* (2013.01); *H01L 21/02024* (2013.01); *H01L 21/30625* (2013.01)

(58) Field of Classification Search
CPC ................ C09G 1/02; H01L 21/30625; H01L 21/02024; C09K 3/1463
See application file for complete search history.

(56) References Cited

U.S. PATENT DOCUMENTS

| | | |
|---|---|---|
| 6,776,810 B1 | 8/2004 | Cherian et al. |
| 8,617,275 B2 | 12/2013 | Hoshi et al. |
| 2014/0154884 A1 | 6/2014 | Kato et al. |

FOREIGN PATENT DOCUMENTS

| | | | |
|---|---|---|---|
| EP | 2717297 A1 | 4/2014 | |
| JP | 2005518091 A | 6/2005 | |
| JP | 2005286224 A | 10/2005 | |
| WO | 03068883 A1 | 8/2003 | |
| WO | WO 2009131133 A1 * | 10/2009 | ........... B24B 37/044 |
| WO | 2012161202 A1 | 11/2012 | |

OTHER PUBLICATIONS

Japan Patent Office/ISA, International Search Report issued in connection with PCT/JP2015/057924 dated Jun. 23, 2015.
Japanese Patent Office, Notice of Reasons for Rejection issued in connection with Application No. 2014-053262 dated Nov. 7, 2017.

* cited by examiner

*Primary Examiner* — Nadine Norton
*Assistant Examiner* — Mahmoud Dahimene
(74) *Attorney, Agent, or Firm* — Thomas Omholt; Erika S. Wilson

(57) ABSTRACT

Provided are a slurry composition to be used in chemical mechanical polishing (CMP), and a method for polishing a substrate. This slurry composition contains water, abrasive grains, and an alkylene polyalkylene oxide amine polymer having a solubility parameter in a range of 9-10. A preferred alkylene polyalkylene oxide amine polymer is given by general formula (1). (In general formula (1), m and n are positive integers, and A and R are alkylene oxide groups.)

6 Claims, 5 Drawing Sheets

FIG. 1

| Exp. | Additive | Solubility Parameter | Additive amounts/ppm | RR | 37nmDCO | | 65nmDCO | |
|---|---|---|---|---|---|---|---|---|
| | | | | | 37nm_LPD | 37nm_Haze DW | 65nm_LPD | 65nm_Haze DW |
| 1 | none | 13.3 | 0 | 312 | 1189 | 0.058 | 143 | 0.060 |
| 2 | Additive 5 | 13.84 | 500 | 277 | 110 | 0.055 | 9 | 0.056 |
| | | 13.84 | 500 | 267 | 94 | 0.052 | 3 | 0.053 |
| | | 13.84 | 500 | 266 | 909 | 0.047 | 73 | 0.048 |
| 3 | Additive 7 | 9.37 | 500 | 131 | 334 | 0.030 | 22 | 0.030 |
| | | 9.37 | 500 | 130 | 266 | 0.030 | 9 | 0.031 |
| 4 | Additive 2 | 13.38 | 500 | 289 | 550 | 0.052 | 17 | 0.054 |
| | | 13.38 | 500 | 279 | 549 | 0.049 | 25 | 0.051 |
| | | 13.38 | 500 | 291 | 569 | 0.045 | 22 | 0.046 |
| 5 | Additive 4 | 12.57 | 500 | 251 | 465 | 0.050 | 7 | 0.051 |
| | | 12.57 | 500 | 234 | 541 | 0.043 | 15 | 0.044 |
| | | 12.57 | 500 | 230 | 634 | 0.033 | 22 | 0.035 |
| 6 | Additive 13 | 16.03 | 500 | 285 | 340 | 0.064 | 13 | 0.065 |
| | | 16.03 | 500 | 321 | 376 | 0.058 | 21 | 0.059 |
| 7 | Additive 15 | - | 500 | 279 | 308 | 0.053 | 17 | 0.054 |
| | | - | 500 | 288 | 305 | 0.050 | 18 | 0.051 |
| 8 | Additive 3 | 13.38 | 500 | 218 | 212 | 0.045 | 14 | 0.046 |
| | | 13.38 | 500 | 222 | 231 | 0.041 | 14 | 0.043 |
| 9 | Additive 9 | 9.37 | 500 | 156 | 310 | 0.033 | 9 | 0.033 |
| | | 9.37 | 500 | 158 | 252 | 0.028 | 42 | 0.029 |
| 10 | Additive 1 | 9.26 | 500 | 182 | 132 | 0.030 | 10 | 0.031 |
| | | 9.26 | 500 | 180 | 178 | 0.026 | 17 | 0.027 |
| 11 | Additive 12 | 13.84 | 500 | 276 | 127 | 0.055 | 18 | 0.055 |
| | | 13.84 | 500 | 275 | 159 | 0.050 | 11 | 0.050 |
| 12 | Additive 11 | 9.26 | 500 | 125 | 396 | 0.030 | 56 | 0.031 |
| | | 9.26 | 500 | 119 | 344 | 0.036 | 34 | 0.037 |
| 13 | Additive 14 | - | 500 | 299 | 404 | 0.056 | 17 | 0.056 |
| | | - | 500 | 298 | 236 | 0.052 | 12 | 0.052 |
| 14 | Additive 10 | 9.2 | 100 | 253 | 268 | 0.040 | 17 | 0.040 |
| | | 9.2 | 100 | 252 | 301 | 0.035 | 22 | 0.036 |
| 15 | Additive 10 | 9.2 | 200 | 205 | 223 | 0.028 | 6 | 0.029 |
| | | 9.2 | 200 | 205 | 264 | 0.026 | 18 | 0.027 |
| 16 | Additive 1 | 9.26 | 300 | 236 | 178 | 0.042 | 23 | 0.043 |
| | | 9.26 | 300 | 236 | 173 | 0.039 | 19 | 0.040 |
| 17 | Additive 11 | 9.26 | 300 | 199 | 204 | 0.037 | 27 | 0.038 |
| | | 9.26 | 300 | 200 | 197 | 0.032 | 17 | 0.033 |
| 18 | Additive 10 | 9.2 | 300 | 154 | 18534 | 0.136 | 5 | 0.138 |
| | | 9.2 | 300 | 136 | 23351 | 0.144 | 17 | 0.146 |
| 19 | Additive 6 | 9.37 | 300 | 191 | 305 | 0.032 | 15 | 0.032 |
| | | 9.37 | 300 | 188 | 382 | 0.032 | 24 | 0.032 |
| | | 9.37 | 300 | 187 | 328 | 0.028 | 10 | 0.029 |
| 20 | Additive 8 | 9.37 | 1000 | 43 | 69294 | 0.241 | 156 | 0.247 |
| | | 9.37 | 1000 | 42 | 66398 | 0.236 | 28 | 0.241 |

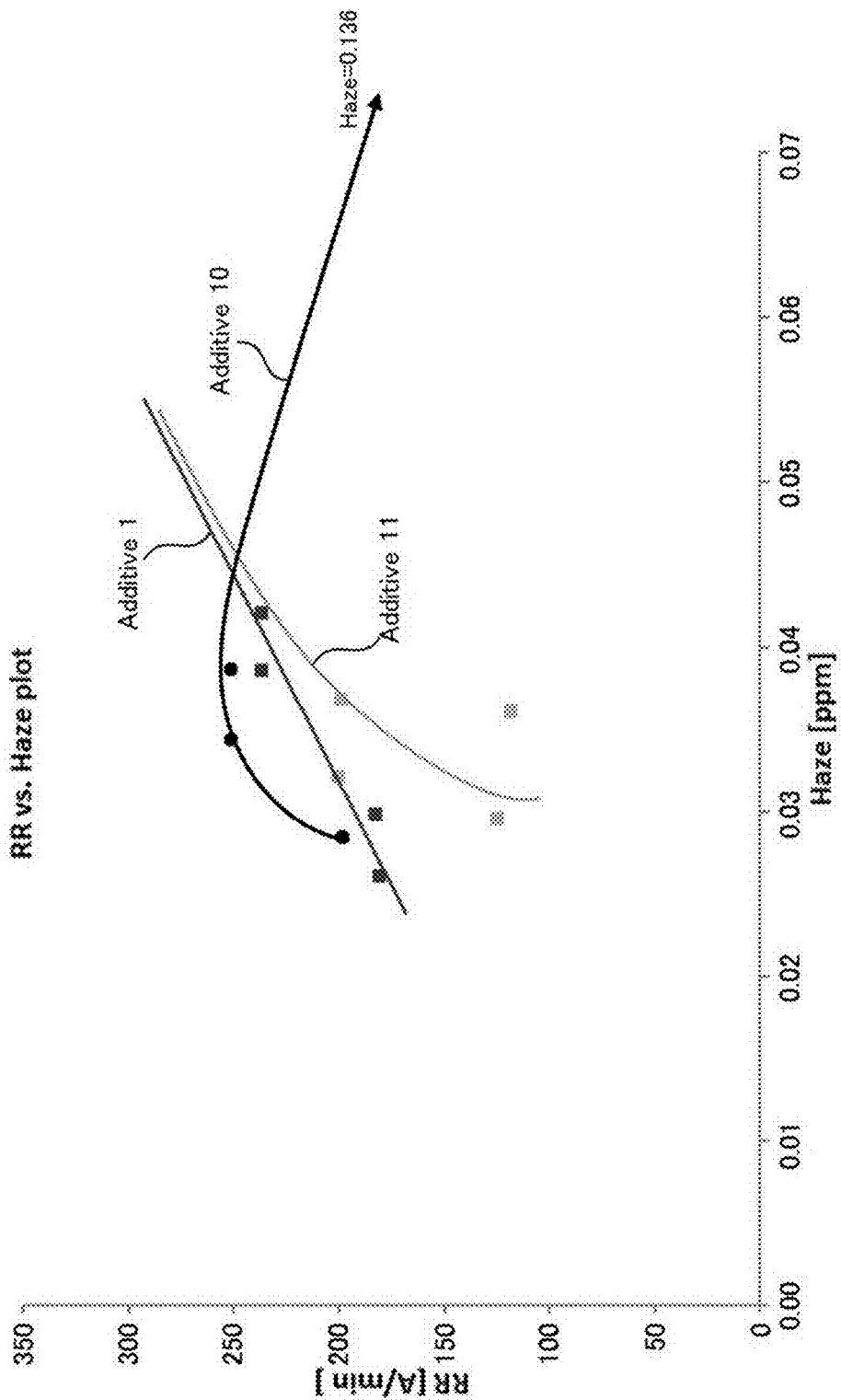

SLURRY COMPOSITION AND METHOD FOR POLISHING SUBSTRATE

TECHNICAL FIELD

The present invention relates to a semiconductor substrate polishing technology, and more particularly, to a slurry composition used in chemical mechanical polishing (CMP) and a method for polishing a substrate.

BACKGROUND ART

Silicon substrates in the form of silicon wafers used in the production of semiconductor substrates are subjected to various types of treatment such as photolithography, deposition treatment or polishing treatment, and are used to provide semiconductor devices. Silicon wafers are applied to numerous processing steps for the purpose of fabricating semiconductor devices, and since there is a need to improve the yield of semiconductor devices, there are strict requirements on the surface quality of the silicon wafers. Chemical mechanical polishing (CMP) has conventionally been used for mirror-polishing silicon wafers to ensure the surface quality thereof.

When polishing a silicon wafer using CMP, typically the silicon wafer is held in a carrier for immobilizing the wafer and clamped between upper and lower surface plates adhered with an abrasive cloth comprised of a synthetic resin foam or suede-like artificial leather, followed by polishing by pressing and rotating the silicon wafer while supplying an aqueous composition dispersed with colloidal particles such as silica, alumina, ceria or zirconia particles (to be referred to as a slurry composition).

In the case of CMP used on silicon wafers, there is a growing demand for improved productivity and surface quality accompanying the increased demand, higher performance levels and higher integration levels of semiconductor devices, and examples of areas where improvements can be made include improved removal rate, surface roughness, haze (surface clouding), flatness (roll-off (end face shear drop), SFQR, ESFQR) and scratch reduction.

Among these required properties, in order to improve decreases in the yield of semiconductor substrates caused by defects in the silicon wafer, it is effective to improve the haze (surface clouding) of the silicon wafer in the CMP process. Various technologies have previously been proposed for improving the surface status of silicon wafers after polishing. For example, Japanese Unexamined Patent Publication No. 2011-97045 (Patent Document 1) describes a technology for improving haze that also improves removal rate by adding an alkylene diamine composition containing a propylene oxide structure to a polishing composition used in CMP.

In addition, Japanese Unexamined Patent Publication No. 2011-97050 (Patent Document 2) describes the application of CMP after adding an alkylene diamine composition containing an oxyethylene group and oxypropylene group to a polishing composition in order to improve surface properties of a silicon wafer after final polishing. Moreover, Japanese Unexamined Patent Publication No. 2013-31914 describes a polishing liquid for electronic materials that is resistant to scratching and contains a fatty acid amine salt that reduces the number of particles adhered to the substrate after polishing.

Although these technologies are known, there has continued to be a need to provide a silicon wafer that realizes suitable removal rate and demonstrates improved surface clouding (haze) in order to improve the product yield of semiconductor substrates.

PRIOR ART DOCUMENTS

Patent Documents

Patent Document 1: Japanese Unexamined Patent Publication No. 2011-97045
Patent Document 2: Japanese Unexamined Patent Publication No. 2011-97050
Patent Document 3: Japanese Unexamined Patent Publication No. 2013-31914

DISCLOSURE OF THE INVENTION

Problems to be Solved by the Invention

With the foregoing in view, an object of the present invention is to provide a slurry composition and method for polishing substrates capable of providing a suitable removal rate (RR) while also providing process compatibility by improving surface clouding (haze) while maintaining light point defects (LPD) in a favorable state.

Means for Solving the Problems

Namely, according to the present invention:
a slurry composition for chemical mechanical polishing can be provided that contains:
water,
abrasive grit, and
a polymer having a solubility parameter within the range of 9 to 10 and containing at least two repeating structural units containing a tertiary amine.

The tertiary amine of the present invention can contain an N-alkylene group, and the repeating structural unit can contain an N-alkylene amine structure.

The polymer of the present invention preferably has a weight average molecular weight of 5,000 to 100,000. The repeating structural unit can contain an N-polyethylene oxide polymer, N-polypropylene oxide polymer or ethylene oxide-propylene oxide copolymer bound to N atoms. The polymer of the present invention can be present at 1 ppm to 5,000 ppm in the slurry composition.

The aforementioned polymer is preferably given by the following general formula (1).

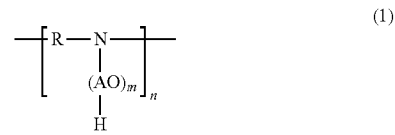

In general formula (1) above, m and n represent positive integers, and A and R represent alkylene groups.

In the present invention, the slurry composition can further contain at least one type of water-soluble polymer selected from the group consisting of a cellulose derivative, poly-N-vinylpyrrolidone, poly-N-vinylacetamide, polyglycerin, PEG, PEO, PEG-PPG block copolymer, ethylene oxide ethylenediamine adduct, poly(2-ethyloxazoline), poly(vinyl alcohol), polyacrylic acid and polyacrylate.

According to the present invention, a method for polishing a substrate can be provided that comprises the steps of:

adhering the aforementioned slurry composition to a polished substrate, and polishing the polished substrate with a polishing pad using the aforementioned slurry.

Effects of the Invention

According to the present invention, a slurry composition and a method for polishing a substrate can be provided that provide a suitable removal rate while improving process compatibility in addition to improving surface clouding.

BRIEF DESCRIPTION OF THE DRAWINGS

FIG. 1 is a drawing in the form of a table correlating the results of measuring haze and RR with various additives and the added amounts thereof.

FIG. 5 is a graph showing the dependency of RR on haze resulting from the addition of Additives 1 and 11.

BEST MODE FOR CARRYING OUT THE INVENTION

Figure 2:
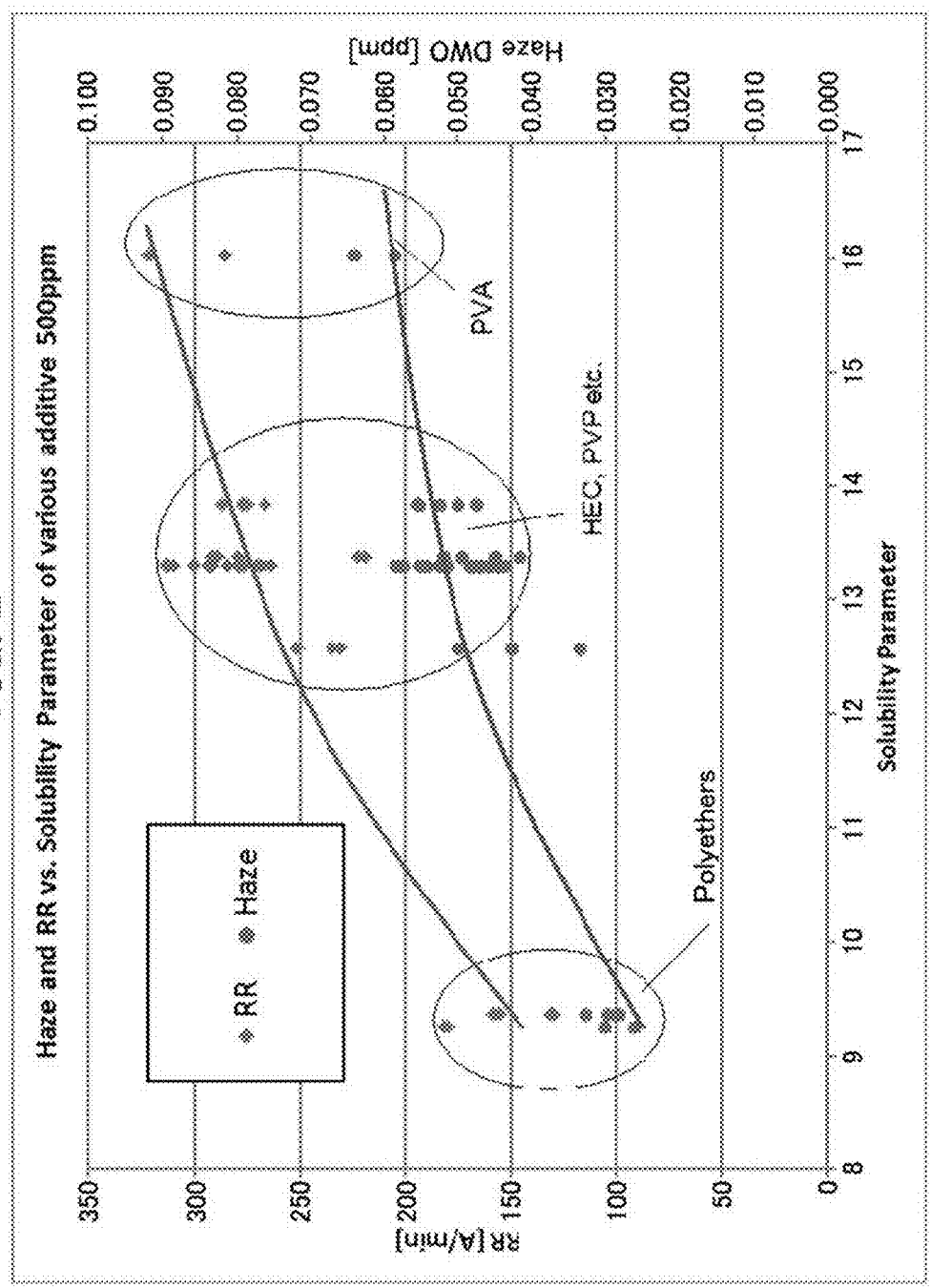
FIG. 2 is a graph showing the dependency of solubility parameter on haze and RR.

Although the following provides an explanation of the present invention through embodiments thereof, the present invention is not limited to the following embodiments. The slurry composition of the present invention for chemical mechanical polishing of a silicon wafer can at least contain a water-soluble polymer and an abrasive.

The slurry composition of the present embodiment preferably at least contains a polymer having a tertiary amine structure in the main chain structure thereof. The addition of a polymer having a tertiary amine structure in the main chain structure thereof to the slurry composition makes it possible to improve surface cloudiness (to be referred to as haze) while improving decreases in RR, as well as maintain LPD in a favorable state while providing wide-ranging process compatibility.

The polymer used in the present invention can be produced by addition polymerizing an alkylene oxide at least including ethylene oxide with an active hydrogen of a polyamine compound having two or more primary amino groups and/or secondary amino groups and containing 4 to 100 nitrogen atoms in a molecule thereof. The weight average molecular weight of the polymer can be within the range of 5,000 to 100,000. In addition, although making the number of N atoms contained in the polymer of the present embodiment to be 2 to 10,000 is preferable from the viewpoint of providing water solubility for applying to a CMP process, the number of N atoms is preferably within the range of 2 to 1,000 from the viewpoint of providing adequate CMP process compatibility. In the present embodiment, this polymer is referred to as an alkylene polyalkylene oxide amine polymer.

Examples of polyamine compounds imparting a main chain structure in the present embodiment include polyethylene polyamines such as triethylenetetramine, tetraethylenepentamine, pentaethylenehexamine or hexaethyleneheptamine, and polyalkyleneimines such as polyethyleneimine obtained by polymerizing ethyleneimine. The aforementioned compounds may be used alone or two or more types may be used in combination to form the polyamine main chain structure of the present embodiment.

Examples of alkylene oxides added to the aforementioned main chain structure include ethylene oxide, propylene oxide and butylene oxide. These alkylene oxides can be used alone or as a mixture of a plurality of types thereof.

The alkylene oxide backbone able to be used in the present embodiment is preferably selected from an ethylene oxide backbone and/or polypropylene backbone. By making the proportion of ethylene oxide in the alkylene oxide added to the polymer of the present embodiment to be 5% or more, preferably 10% or more or 50% to 90%, preferable CMP process compatibility can be imparted. In addition, in the case of containing a propylene oxide backbone in the present embodiment, containing within a range of 10% to 20% is similarly preferable in terms of widening the process margin.

The polymer of the present embodiment can be easily produced by an ordinary method. For example, the polymer of the present embodiment can be produced by addition polymerizing (graft polymerizing) alkylene oxide to a starting substance in the form of the aforementioned polyamine compound at 100° C. to 180° C. and 1 atm to 10 atm in the presence of an alkaline catalyst.

There are no particular limitations on the mode in which the alkylene oxide is added to the main chain backbone in the form of the polyamine compound, and may be in the form of block addition or random addition in the case of a form in which two or more types of alkylene oxides are added. The polymer of the present embodiment can have a weight average molecular weight of 5,000 or more and preferably 10,000 or more, and can preferably be within the range of 100,000 or less and more preferably 8,000 or less. In the case the weight average molecular weight is excessively low, haze cannot be adequately improved, while in the case it is excessively high, the dependency of each property on the added amount increases which narrows the process margin, thereby making this undesirable.

The main chain structure in the present description refers to a structure containing two or more repeating structural units containing a tertiary amine obtained by graft polymerizing polyalkylene oxide. Moreover, the tertiary amine that composes the main chain structure of the present embodiment preferably contains an N-alkylene group. There are no particular limitations on the number of C atoms that compose the N-alkylene group, and a linear or branched alkylene group having a number of C atoms within the range of 2 to 10 can be selected.

Specific examples of the polymer of the present embodiment include polymers represented by the following general formula (1) containing at least a tertiary amine structure in the main chain structure thereof formed by addition polymerization of an alkylene oxide to a polyethylene polyamine.

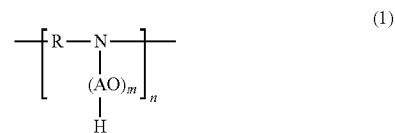

(1)

In general formula (1) above, m and n represent positive integers and A represents an alkylene group. R represents a linear or branched alkylene group having 2 or more carbon atoms. In the present embodiment, m can be within the range of 2 to 1000 and preferably 2 to 20, and n can be within the range of 2 to 10,000 and preferably 2 to 500. This is because, if the chain length of A is excessively long, haze improvement decreases, and if n is 10,000 or more, the dependency of each property on the amount added increases, thereby having a detrimental effect on process margin. AO can be formed using two or more types of alkylene oxides, and in the case of the present embodiment, different alkylene oxide groups may be in block form or random form.

The solubility parameter of the alkylene polyalkylene oxide amine polymer given by the aforementioned chemical formula (1) in the present invention is preferably within the range of 9 to 10. Furthermore, solubility parameter (SP) in the present description refers to the SP value of a water-soluble polymer in terms of the SP value of the monomer determined using the method of Fedors described in Ueda, et al, Coating Film Research, No. 152, October 2010, pp. 41-46. If the aforementioned solubility parameter is less than 9.0, compatibility with aqueous solutions decreases and adequate effects are unable to be provided, while if the SP value is greater than 10.0, adequate haze improvement tends to inherently be difficult.

A particularly preferable example of the polymer in the present embodiment is indicated by the following general formula (2).

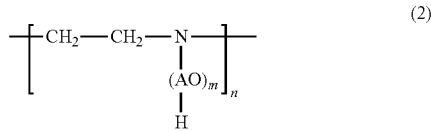

In general formula (2) above, A, m and n are the same as defined in the aforementioned general formula (1).

Moreover, preferable examples of the water-soluble polymer able to be used with the previously described alkylene polyalkylene oxide amine polymer in the present invention include homopolymers and α-copolymers formed by polymerizing a vinyl monomer, and specific examples thereof include styrene, chlorostyrene, α-methylstyrene, divinylbenzene, vinyl carboxylates such as vinyl acetate, vinyl proprionate, vinyl butyrate, vinyl octylate, vinyl caprate, vinyl laurate, vinyl myristate, vinyl stearate, vinyl adipate, vinyl (meth)acrylate, vinyl crotonate, vinyl sorbate, vinyl benzoate or vinyl cinnamate, acrylonitrile, limonene, cyclohexene, N-vinyl compounds such as 2-vinylpyridine, 3-vinylpyridine, 4-vinylpyridine, N-vinylpyrrolidone, N-vinylacetamide or N-vinylmethylacetamide, cyclic ether vinyl compounds such as vinylfuran or 2-vinyloxytetrapyran, monovinyl ethers such as methyl vinyl ether, ethyl vinyl ether, propyl vinyl ether, butyl vinyl ether, amyl vinyl ether, 2-ethylhexyl vinyl ether, octyl vinyl ether, nonyl vinyl ether, dodecyl vinyl ether, hexadecyl vinyl ether, octadecyl vinyl ether, butoxyethyl vinyl ether, cetyl vinyl ether, phenoxyethyl vinyl ether, allyl vinyl ether, methallyl vinyl ether, glycidyl vinyl ether, 2-chloroethyl vinyl ether or cyclohexyl vinyl ether, homopolymers such as ethylene glycol monovinyl ether, polyethylene glycol monovinyl ether, propylene glycol monovinyl ether, polypropylene glycol monovinyl ether, 1,3-butylene glycol monovinyl ether, tetramethylene glycol monovinyl ether, hexamethylene glycol monovinyl ether, neopentyl glycol monovinyl ether, trimethylolpropane monovinyl ether, glycerin monovinyl ether, pentaerythritol monovinyl ether or 1,4-cyclohexane dimethanol monovinyl ether, arbitrary combinations of copolymers, and water-soluble polymers or copolymers, and the degree of saponification thereof can be adjusted in order to improve water solubility.

In addition to the aforementioned acrylic resins, cellulose derivatives such as methyl cellulose, hydroxyethyl cellulose, hydroxypropyl cellulose or hydroxypropyl methyl cellulose can be used in the present invention. Cellulose derivatives having an average molecular weight of 100,000 to 2,000,000 can be used.

Specific examples of water-soluble polymers that can be used in the present invention in combination with the alkylene polyalkylene oxide amine polymer of the present embodiment include, but are not limited to, poly-N-vinylpyrrolidone, poly-N-vinylacetamide, poly-N-vinylmethylacetamide, polyalkylene oxide polymers in the manner of PEG or PEO having an average molecular weight of 200 to 110,000, poly-2-ethyloxazoline and mixtures thereof. Furthermore, average molecular weight as referred to in the present invention refers to the value in the manner of weight average molecular weight, number average molecular weight or degree of polymerization obtained in accordance with known methods for measuring molecular weight, and the measurement method is not limited to a specific measurement method.

Specific examples of water-soluble polymers able to be used in combination include known commercially available water-soluble polymers such as poly-N-vinylpyrrolidone, poly-N-vinylacetamide, polyglycerin PEG, PEO, PEG-PPG block copolymers, ethylene oxide ethylenediamine adducts, poly-2-ethyloxazoline, poly(vinyl alcohol), polyacrylic acid and polyacrylate.

More specific examples of water-soluble polymers able to be used in combination include poly-N-vinylpyrrolidone, poly-N-vinylacetamide, polyglycerin, PEG/PEO having a molecular weight of 1,000 to 1,000,000, PEG-PPG block copolymers, alkylene oxide ethylenediamine adducts (EO weight ratio: 35%, PPG molecular weight: 4,400, reverse type), poly-2-ethyl-2-oxazoline, average molecular weight: 500,000), poly(vinyl alcohol) (average molecular weight: 200,000), polyacrylic acid (average molecular weight: 25,000) and polyacrylate (average molecular weight: 5,000).

The added amount of alkylene polyalkylene oxide amine compound in the slurry composition of the present invention can be within the range of 1 ppm (0.001% by weight) to 5,000 ppm (0.5% by weight). In addition, the alkylene polyalkylene oxide amine compound is preferably added within the range of 10 ppm to 1,000 ppm from the viewpoint of maintaining the silicon wafer removal rate at a realistically high production throughput, and is more preferably added within the range of 50 ppm to 1,000 ppm from the viewpoint of not requiring adjustment of other slurry components.

In addition to the aforementioned water-soluble polymer, the slurry composition of the present invention can also contain polishing components such as abrasive grit, acid or base, buffers, catalysts or various types of salts. An abrasive grit commonly used in polishing applications can be used for the abrasive grit used in the present invention. Examples of abrasive grit include metal, metallic or semi-metallic carbides, nitrides, oxides, borides and diamonds.

The abrasive grit able to be used in the present invention is preferably a metal oxide so as to be able to polish a substrate surface without introducing harmful scratches (marks) or other defects onto the substrate surface. Preferable examples of metal oxide abrasive grit include alumina, silica, titania, ceria, zirconia, magnesia, co-formed products thereof, mixtures thereof and chemical admixtures thereof. Typically, the abrasive grit is selected from the group consisting of alumina, ceria, silica, zirconia and combinations thereof. Silica, and particularly colloidal silica, and ceria, are preferable for the abrasive grit, and colloidal silica is more preferable.

The slurry composition of the present invention can be formed by dispersing the abrasive grit in a preferable liquid carrier, adding various types of additives such as a water-soluble polymer, and forming in the form of a dispersion or suspension. Preferable examples of liquid carriers include polar solvents, and preferably water or aqueous solvents, and in the case abrasive grit is contained in the slurry, the slurry preferably contains abrasive grit at a concentration at the time of polishing of 0.1% by weight or more and more preferably 0.1% by weight to 50% by weight, while more preferably, 0.1% by weight to 5% by weight of colloidal silica is added as abrasive grit to the slurry composition.

The pH of the slurry composition of the present invention can be suitably adjusted in consideration of removal rate. In the present invention, the pH of the slurry composition is preferably 5 to 12 and more preferably within the range of 7 to 12 during polishing treatment of a silicon wafer.

The mean particle diameter of primary particles of the abrasive grit is preferably 0.01 µm to 3 µm, more preferably 0.01 µm to 0.8 µm and particularly preferably 0.02 µm to 0.5 µm from the viewpoint of improving removal rate. Moreover, in the case of the primary particles aggregating to form secondary particles, the mean particle diameter of the secondary particles is preferably 0.02 µm to 3 µm, more preferably 0.05 µm to 1.5 µm and particularly preferably 0.06 µm to 1.2 µm similarly from the viewpoint of improving removal rate as well as from the viewpoint of reducing surface roughness of the polished material. Furthermore, the mean particle diameter of primary particles of the abrasive grit can be determined by observing with a scanning electron microscope or transmission electron microscope, analyzing the resulting images and measuring the particle diameter. In addition, the mean particle diameter of secondary particles can be measured as volume average particle diameter using laser light scattering.

In the present invention, various other additives can be used corresponding to the polished substrate. Examples of preferable additives able to be present in the polishing system include amines, ammonium salts, alkaline metal ions, film forming agents, complexing agents, surfactants, rheology control agents, polymeric stabilizers, dispersants and/or halide ions. Additives can be present in the polishing system at any preferable concentration.

An amine compound can also be added to the slurry composition, and an aliphatic amine, cyclic amine, heterocyclic amine, aromatic amine, polyamine or combinations thereof can be selected for the amine compound. In a preferred embodiment, the amine compound can contain at least one oxygen atom and at least one polar moiety in the manner of an amino acid or aminoalcohol, and specific examples of amine compounds that can be contained include dimethylpropanolamine (also known as 2-dimethylamino-2-methyl-1-propanol or DMAMP), 2-amino-2-methyl-1-propanol (AMP), 2-(2-aminoethylamino)ethanol, 2-(isopropylamino)ethanol, 2-(methylamino)ethanol, 2-(diethylamino)ethanol, 2-(2-(dimethylamino)ethoxy)ethanol, 1,1'-[[3-(dimethylamino)propyl]imino]-bis-2-propanol, 2-(butylamino)ethanol, 2-(tert-butylamino)ethanol, 2-(diisopropylamino)ethanol, N-(3-aminopropyl)morpholine and mixtures thereof.

In addition to the amine compound, an ammonium salt can also be added in the present invention, and examples thereof that can be used include hydroxylated amines (such as tetramethylammonium hydroxide (TMAH)) and quaternary ammonium compounds.

An alkaline metal ion may also be present in the slurry composition as a counter ion of various types of salts. Preferable examples of alkaline metal ions include monovalent base metal ions of group I of the periodic table. Specific examples of alkaline metal ions that can be used include sodium ions, potassium ions, rubidium ions and cesium ions. Potassium ions and cesium ions are preferable and potassium ions are more preferable.

Furthermore, in the present invention, an anticorrosive agent can be used with the polishing system, and examples of anticorrosive agents include alkylamines, alkanolamines, hydroxylamines, phosphate esters, sodium lauryl sulfate, fatty acids, polyacrylates, polymethacrylates, polyvinyl phosphonates, polymalates, polystyrenesulfonates, polyvinyl sulfonates, benzotriazole, triazoles, benzimidazole and mixtures thereof.

Moreover, in the present invention, a chelating agent and the like can be arbitrarily added to the slurry composition. Examples of chelating agents include carbonyl compounds such as acetylacetonate, carboxylic acid salts such as acetates or aryl carboxylates, carboxylic acid salts having at least one hydroxyl group such as glycolates, lactates, gluconates, gallic acid and salts thereof, dicarboxylic acid salts, tricarboxylic acid salts, polycarboxylic acid salts (such as oxalates, phthalates, citrates, succinates, tartrates or malates), edetic acid salts such as disodium EDTA and mixtures thereof. Preferable examples of chelating agents include dialcohols such as ethylene glycol, pyrocatechol, pyrogallol or tannic acid, trialcohols, polyvalent alcohols and phosphate-containing compounds.

In the present invention, a surfactant, viscosity modifier or coagulating agent can be arbitrarily used with the polishing system. Preferable examples of viscosity modifiers include urethane polymers and acrylic acid salts having at least one acrylic unit. More specifically, examples of viscosity modifiers include low molecular weight carboxylic acid salts and high molecular weight polyacrylamide compounds, and preferable examples of surfactants include cationic surfactants, anionic surfactants, anionic polyelectrolytes, nonionic surfactants, amphoteric surfactants, fluorinated surfactants and mixtures thereof.

The substrate can be polished with a polishing system provided with a suitable polishing pad. A woven or non-woven polishing pad can be preferably used for the polishing pad. More specifically, a synthetic resin polishing pad can be used as a preferable polishing pad, and preferable examples of polymers include polyvinyl chloride, polyvinyl fluoride, nylon, fluorocarbon, polycarbonate, polyester, polyacrylate, polyether, polyethylene, polyamide, polyurethane, polystyrene, polypropylene, conformed products thereof and mixtures thereof.

In addition, the slurry composition and substrate polishing method of the present invention can not only be applied to silicon substrates, but also to silicon substrates having a polysilicon film, $SiO_2$ film or metal wiring film formed thereon, sapphire substrates, SiC substrates, GaAs substrates, GaN substrates and other substrates applicable to polishing treatment. In addition to being able to be applied to a method consisting of preparing a slurry composition in advance followed by supplying the prepared slurry composition to the polished substrate while polishing with a polishing pad, the present invention can also be applied to a polishing method for carrying out so-called in-situ formulation and preparation consisting of supplying a diluent and undiluted slurry liquid to a polishing pad followed by preparing the slurry composition for substrate polishing in the vicinity of the polishing pad.

Although the aforementioned description has provided a detailed explanation of the present invention through embodiments thereof, the following provides a more detailed explanation of the present invention using examples. Furthermore, the subsequently described examples are provided for the purpose of facilitating understanding of the present invention, and are not intended to limit the present invention in any way.

EXAMPLES

A plurality of water-soluble polymers are added to a slurry solution to prepare the slurry composition of the present invention followed by measurement of the LPD, removal rate (RR) and surface clouding (haze) thereof. Preparation of the slurry composition and silicon wafer polishing conditions are as described below.

1. Preparation of Slurry Composition

Each of the following compounds were added at varying concentrations to a slurry composition containing 7% by weight of colloidal silica, water adjusted to pH 10.5 with ammonia and 300 ppm of hydroxyethyl cellulose to prepare slurry compositions.

(1) Alkylene polyalkylene oxide polyamine polymer represented by general formula (1), average molecular weight: approx. 46,000, EO:PO (weight ratio)=approx. 8:1 (to be referred to as Additive 1)

(2) Poly-N-vinylpyrrolidone K90 (to be referred to as Additive 2)

(3) Poly-N-vinylpyrrolidone K15 (to be referred to as Additive 3)

(4) Poly(2-ethyloxazoline) (to be referred to as Additive 4)

(5) Polyglycerin (average molecular weight: 40,000) (to be referred to as Additive 5)

(6) PEG8000 (to be referred to as Additive 6)

(7) PEO (average molecular weight: 40,000) (to be referred to as Additive 7)

(8) PEO (average molecular weight: 400,000) (to be referred to as Additive 8)

(9) PEO (average molecular weight: 1,000,000) (to be referred to as Additive 9)

(10) Ethylene oxide ethylenediamine adduct (to be referred to as Additive 10)

(11) PEG-PPG block copolymer (to be referred to as Additive 11)

(12) Poly-N-vinylacetamide (to be referred to as Additive 12)

(13) Poly(vinyl alcohol) (to be referred to as Additive 13)

(14) Polyacrylic acid (Mw: 25,000, to be referred to as Additive 14)

(15) Polyacrylate (to be referred to as Additive 15)

2. Polishing Conditions

After cleaning 8-inch, p-type silicon wafers (resistivity: 0.1 Ω·cm to 100 Ω·cm, crystal orientation <100>) with hydrofluoric acid (0.5%) for 2 minutes at 23° C. to remove the natural oxide film, the slurry composition prepared in 1 above was diluted 20-fold with water followed by applying polishing treatment under the conditions indicated below.

(1) Polishing device: 8-inch, one-side polishing machine, MAT-ARW-681MS, MAT Inc.

(2) Wafer head: Template-type held by water surface tension (3) Polishing pad: SPM3100, Dow Corp.

(4) Surface plate rotating speed: 30 rpm (5) Polishing head rotating speed: 26 rpm (6) Polishing pressure: 3 psi=210 g/cm$^2$=20.7 kPa (7) Slurry supply rate: 350 mL/min (flow over)

(8) Polishing time: 5 min

After batch washing the polished silicon wafers for 20 minutes at 23° C. with SC-1 (ammonia (29% by weight aqueous solution):hydrogen peroxide (31% by weight aqueous solution):pure water=1:1:4 (volume ratio) solution), the polished wafers were subsequently further washed by PVA brush scrubbing at 23° C. with SC-1 (ammonia (29% by weight aqueous solution):hydrogen peroxide (31% by weight aqueous solution):pure water=1:4:20 (volume ratio) solution) using the SC-2005 manufactured by Shibaura Mechatronics Corp. followed by rinsing with pure water.

3. Measurement Methods

Surface roughness (haze) of the washed silicon wafer surface was measured in the dark-field wide oblique (DWO) mode using the Surfscan SP2 manufactured by KLA-Tencor Corp. followed by using the resulting DWO value. LPD were measured using the same Surfscan SP2 manufactured by KLA-Tencor Corp., and using the value of LPD having a size of 37 nm or larger in the dark-field wide oblique (DWO) mode. In addition, removal rate was measured by dividing wafer weight difference before and after polishing by silicon wafer density, surface area and polishing time to determine the removal rate per unit time. Measurements were carried out at least twice for the same additive and under the same conditions, and the average value thereof was used for each value 4. Results The measurement results for each additive are shown in FIGS. 1 to 4. FIG. 1 shows the measurement results of haze and RR in the form of a table correlating the additives and amounts added. FIG. 2 shows the dependency of haze and RR on the solubility parameter. Furthermore, in FIG. 2, ◇ symbols indicate removal rate (RR) and ○ symbols indicate haze. As shown in FIG. 2, as the solubility parameter became smaller, haze decreased in comparison with the decrease in RR (upper curve in the graph), or in other words, a tendency for haze to improve was observed.

Figure 3:
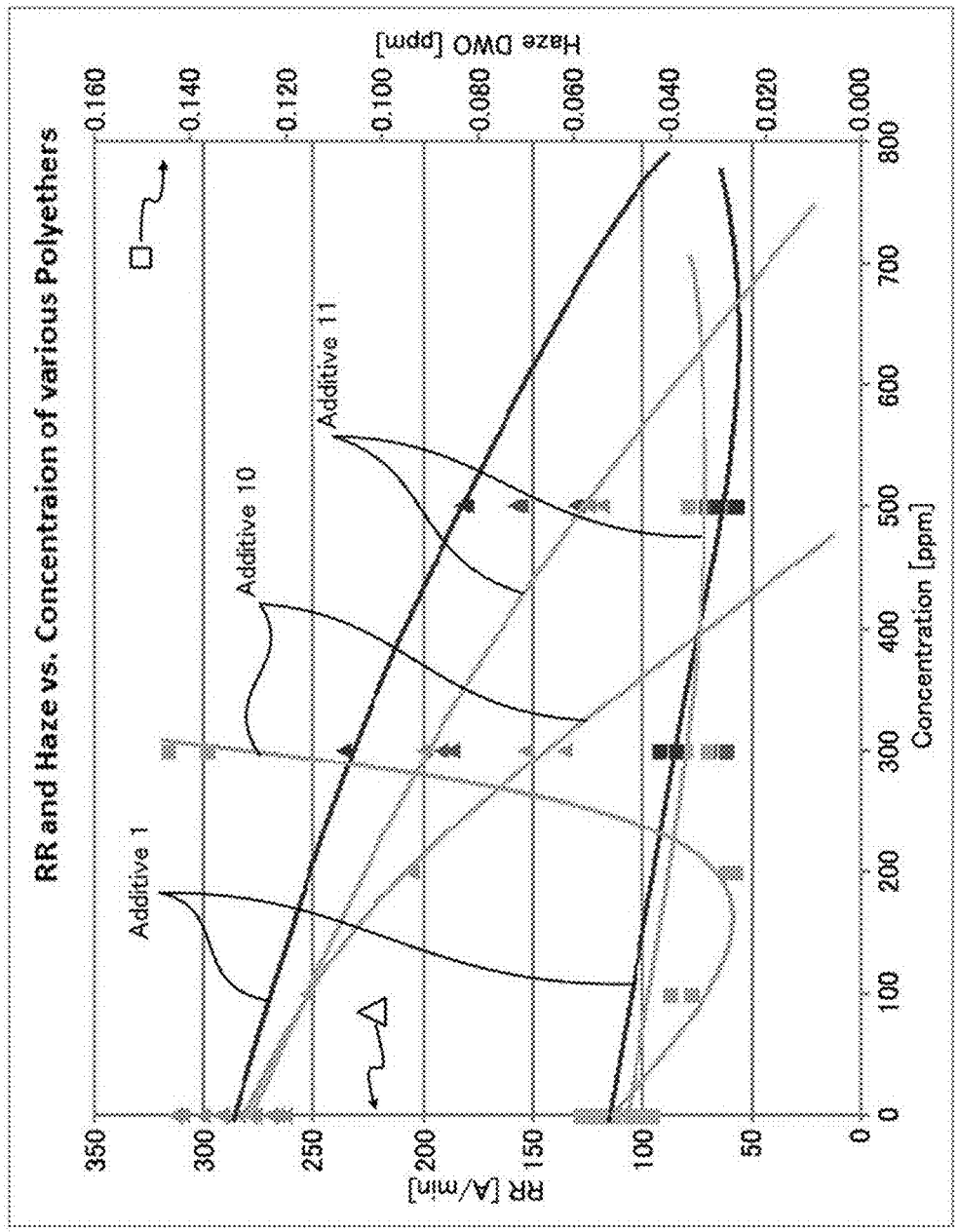
FIG. 3 is a graph plotting the respective dependencies of additive concentration on RR and haze for Additives 1, 10 and 11.

FIG. 3 is a graph plotting the respective dependencies of additive concentration on RR and haze for Additives 1, 10 and 11 containing both an ethylene oxide chain and propylene oxide chain. In FIG. 3, Δ symbols indicate RR and □ symbols indicated haze. As shown in FIG. 1, the SP values of Additives 1, 10 and 11 are roughly the same. As shown in FIG. 3, when the added concentration of any of the additives increases, haze is shown to improve accompanying a decrease in RR. In addition, as shown in FIG. 1, the numbers of LPD demonstrated values of 300 or less dependent on additive concentration for any of Additives 1, 10 and 11.

Figure 4:
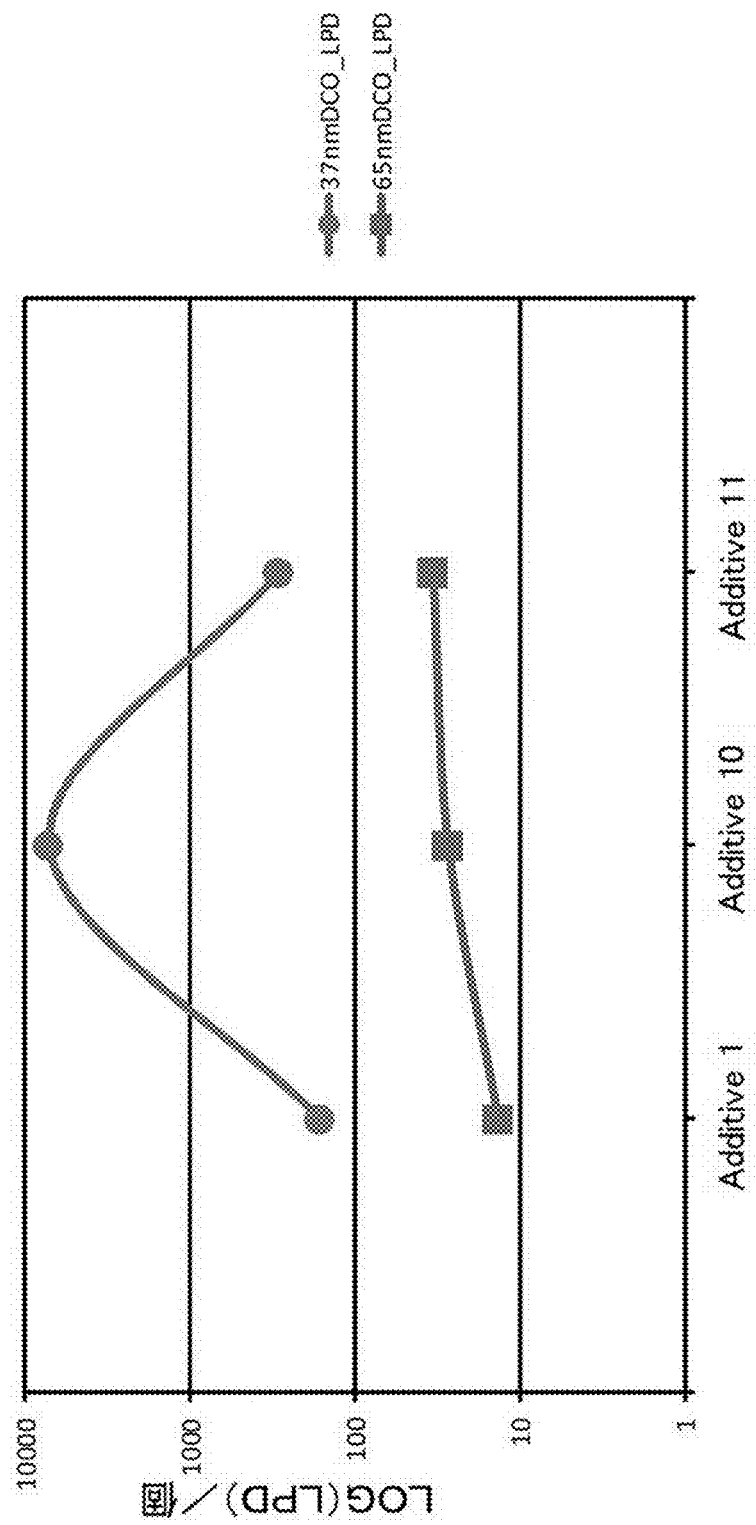
FIG. 4 is a graph showing the LPD values of Additives 1, 10 and 11.

FIG. 4 is a graph showing the average LPD values at 37 nm DCO and 65 nm DCO for each of the Additives 1, 10 and 11. As shown in FIG. 4, Additive 1 yielded an average LPD value of 165 at 37 nm DCO and 13.5 at 65 nm DCO. These LPD values demonstrated improvements in LPD values of at least 2-fold or better in comparison with the average LPD values of 7155.5 at 37 nm DCO and 27.3 at 65 nm DCO for Additive 10, and the average LPD values of 285.3 at 37 nm DCO and 33.5 at 65 nm DCO for Additive 11.

Here, Additives 1 and 10 are both additives that contain an amine structure, and although the concentrations that yield the minimum value of haze differ, they demonstrated similar degrees of haze improvement. On the other hand, in the case of comparing the PEO-PPO block copolymer in the form of Additive 11 with Additives 1 and 10 containing an amine structure, improvement of haze was shown to reach its limit even if additive concentration was increased.

Moreover, when Additive 1 is compared with Additive 10, Additive 1 was shown to improve haze roughly linearly while maintaining RR up to high concentrations. On the other hand, Additive 10 demonstrated remarkable improvement of haze at low concentrations of the addition of Additive 10. However, the concentration dependency of Additive 10 was extreme, and in the case of attempting to improve haze while maintaining RR within a suitable range, the concentration range thereof was narrow in comparison with Additive 1, thereby preventing the obtaining of an adequate process margin.

FIG. 5 is a graph showing the dependency of RR on haze resulting from the addition of Additives 1 and 11. As shown in FIG. 5, the PEO-PPO block copolymer in the form of Additive 11 resulted in a decrease in RR at an earlier stage than improvement of haze, and as a result thereof, demonstrated non-linear dependency. On the other hand, in the case of the alkylene polyalkylene oxide amine copolymer of the present embodiment in the form of Additive 1, sudden decreases in RR were shown to be inhibited. As a result, improvement of RR and haze in the case of Additive 1 did not yield a relationship indicating a high degree of tradeoff, and was determined to yield a roughly linear relationship. Consequently, Additive 1 did not result in extremely narrow process compatibility in the manner of Additive 10, and was shown to be able to demonstrate scalable improvement of haze while maintaining adequate process compatibility.

Moreover, Additive 10 can be said be superior to Additive 1 with respect to not causing a decrease in RR overall. However, in the case of comparing haze at about the same level of RR, Additive 10 was shown to cause much greater deterioration of haze (value becomes large) in comparison with Additive 1. This is because Additive 10 has an extremely narrow added concentration range for improving haze, and as a result thereof, was unable to provide adequate process stability.

As has been described above, according to the present invention, a slurry composition and substrate polishing method can be provided that simultaneously improve haze and LPD value while inhibiting decreases in RR, while also making it possible to expand the range of process compatibility.

Although the previous description has provided an explanation of the invention using embodiments thereof, the present invention can be modified with respect to the incorporation of other embodiments, additions, modifications or deletions and the like within a range that can be conceived by a person with ordinary skill in the art, and any of these aspects are included within the scope of the present invention provided the action and effects of the present invention are still demonstrated.

The invention claimed is:

1. A slurry composition for chemical mechanical polishing, containing:
    water,
    abrasive grit, and
    a polymer containing at least two repeating structural units containing a tertiary amine, wherein the polymer is given by the following general formula (1):

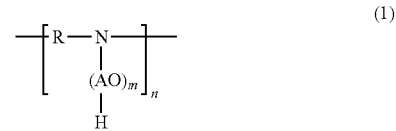

wherein, m and n represent positive integers and A and R represent alkylene groups.

2. The slurry composition according to claim 1, wherein the polymer has a weight average molecular weight of 5,000 to 100,000.

3. The slurry composition according to claim 1, wherein the repeating structural unit contains an N-polyethylene oxide polymer, N-polypropylene oxide polymer or ethylene oxide-propylene oxide copolymer bound to N atoms.

4. The slurry composition according to claim 1, wherein the polymer is present at 1 ppm to 5,000 ppm in the slurry composition.

5. The slurry composition according to claim 1, further containing at least one water-soluble polymer selected from the group consisting of a cellulose derivative, poly-N-vinylpyrrolidone, poly-N-vinyl acetamide, polyglycerin, PEG, PEO, PEG-PPG copolymer, ethylene oxide ethylenediamine adduct, poly(2-ethyloxazoline), poly(vinyl alcohol), polyacrylic acid and polyacrylate.

6. A method for polishing a substrate, comprising the steps of:
    adhering the slurry composition according to claim 1 to a polished substrate, and
    polishing the polished substrate with a polishing pad using the slurry.

* * * * *

UNITED STATES PATENT AND TRADEMARK OFFICE
CERTIFICATE OF CORRECTION

PATENT NO.         : 9,914,853 B2
APPLICATION NO.    : 15/126543
DATED              : March 13, 2018
INVENTOR(S)        : Tsuyoshi Masuda et al.

It is certified that error appears in the above-identified patent and that said Letters Patent is hereby corrected as shown below:

In the Claims

In Column 12, Claim 5, Line 41, delete "poly-N-vinyl acetamide," and insert --poly-N-vinylacetamide,--.

Signed and Sealed this
Twenty-fourth Day of April, 2018

Andrei Iancu
*Director of the United States Patent and Trademark Office*